United States Patent [19]

Jeng

[11] Patent Number: 5,753,962
[45] Date of Patent: May 19, 1998

[54] TEXTURIZED POLYCRYSTALLINE SILICON TO AID FIELD OXIDE FORMATION

[75] Inventor: Nanseng Jeng, Boise, Id.

[73] Assignee: Micron Technology, Inc., Boise, Id.

[21] Appl. No.: 710,397

[22] Filed: Sep. 16, 1996

[51] Int. Cl.$^6$ ................................................ H01L 29/00
[52] U.S. Cl. .................. 257/510; 257/296; 257/301;
                          257/502; 257/505; 257/506; 257/520
[58] Field of Search ................................ 296/296, 501,
                          296/505, 506, 510, 520

[56] References Cited

U.S. PATENT DOCUMENTS

| | | | |
|---|---|---|---|
| 4,541,167 | 9/1985 | Hayermann et al. | 59/576 |
| 4,868,136 | 9/1989 | Ravaglia | 437/38 |
| 4,892,614 | 1/1990 | Chapman et al. | 156/643 |
| 4,980,311 | 12/1990 | Namose | 437/67 |
| 5,087,586 | 2/1992 | Chan et al. | 437/72 |
| 5,130,268 | 7/1992 | Liou et al. | 437/67 |
| 5,191,509 | 3/1993 | Wen | 361/311 |
| 5,214,496 | 5/1993 | Sunami et al. | 257/296 |
| 5,326,715 | 7/1994 | Jang et al. | 437/70 |
| 5,342,480 | 8/1994 | Nishizawa et al. | 156/648 |
| 5,387,538 | 2/1995 | Moslehi | 437/67 |
| 5,393,692 | 2/1995 | Wu | 437/69 |
| 5,438,016 | 8/1995 | Figura et al. | 437/67 |
| 5,470,783 | 11/1995 | Chiu et al. | 437/72 |
| 5,640,041 | 6/1997 | Lur et al. | 257/510 |

FOREIGN PATENT DOCUMENTS

| | | |
|---|---|---|
| 5911645 | 1/1984 | Japan . |
| 5922342 | 2/1984 | Japan . |
| 5965446 | 4/1984 | Japan . |
| 60121737 | 6/1985 | Japan . |
| 061228650 | 10/1986 | Japan . |
| 61228650 | 10/1986 | Japan . |
| 61256649 | 11/1986 | Japan . |
| 6214439 | 1/1987 | Japan . |
| 6387741 | 4/1988 | Japan . |
| 63137457 | 6/1988 | Japan . |
| 63155747 | 6/1988 | Japan . |
| 01282839 | 2/1990 | Japan . |
| 250430 | 2/1990 | Japan . |
| 2260639 | 10/1990 | Japan . |
| 334556 | 2/1991 | Japan . |
| 3218049 | 9/1991 | Japan . |
| 513566 | 1/1993 | Japan . |

OTHER PUBLICATIONS

"Reduced Bird's Beak Roi Process"–IBM Technical Disclosure Bulletin, vol. 29, No. 2, Jul. 1986.

"A Novel Locos–Type Isolation Technology Free of the Field Oxide Thinning Effect"–1993 International Conference on Solid State Devices and Materials, Makuhari, 1993, pp. 528–530.

Ghandhi "VLSI Fabrication Principles", 1983, pp. 479–482 and pp. 495–497.

Toshiyuki Nishihara et al., "A 0.5um Isolation Technology Using Advanced Poly Silicon Pad LOCOS(Appl)", *IEEEU, 19988, pp. 100–103*.

H.S. Yang et al., "Poly Void Formation in Poly Buffer LOCOS Process", Extended Abstracts of the Spring Electrochemical Society meetings, 1992, p. 442.

J.M. Sung "The Impact of Poly–Removal Techniques on Thin Thermal Oxide Property in Poly–Buffer LOCOS Technology", *IEEE Transactions on Electron Devices*, Aug. 1991, pp. 1970–1973.

(List continued on next page.)

*Primary Examiner*—Sara W. Crane
*Assistant Examiner*—Douglas A. Wille

[57] ABSTRACT

A method of forming field oxide during the manufacture of a semiconductor device comprises the steps of providing a semiconductor wafer having a plurality of recesses or trenches therein. A layer of texturized polycrystalline silicon is formed within the recesses, which is subsequently oxidized to form field oxide. The instant method reduces stress imparted to the die as the texturized polycrystalline silicon has voids or holes which absorb the expanding volume as the silicon is oxidized to form field oxide.

22 Claims, 1 Drawing Sheet

OTHER PUBLICATIONS

R.L. Guldi, "Characterization of Poly-Buffered LOCOS in Manufacturing Evironment", *J. Electrochem. Soc.*, Dec. 1989, pp. 3815–3820.

Tin-hwang Lin, "Twin-White-Ribbon Effect and Pit Formation Mechanism in PBLOCOS", *J. Electrochem. Soc.*, Jul. 1991, pp. 2145–2149.

M. Ghezzo, "LOPOS: Advanced Device Isolation for a 0.8um CMOS/BULK Process Technology", *Journal of the Electrochemical Society*, Jul. 1989, pp. 1992–1996.

N. Shimizu et al., "A Poly-Buffer Recessed LOCOS Process for 256Mbit Dram Cells", *IEEE IEDM* 92-2779, pp. 10.6.1–10.6.4.

TEXTURIZED POLYCRYSTALLINE SILICON TO AID FIELD OXIDE FORMATION

FIELD OF THE INVENTION

The invention relates to the field of semiconductor manufacture, and more specifically to a method for forming thick oxide such as field oxide.

BACKGROUND OF THE INVENTION

During the manufacture of semiconductor devices such as random access memories, microprocessors, and other devices formed using a silicon wafer substrate assembly or other semiconductive wafer substrate assemblies, a thick field oxide layer is typically formed for use as an isolation structure. To form field oxide an oxidation-resistant layer such as silicon nitride is patterned over the wafer assembly which leaves portions of the wafer exposed. The exposed areas are subjected to heat and moisture, usually for a relatively long period of time, to form a field oxide layer typically at least 5000 Å thick.

One problem which can occur with the process described above is field oxide thinning which results from forming field oxide in exposed wafer areas having different widths. The field oxide tends to form thinner in narrow areas and thicker in wider areas. A process which has been used to decrease field oxide thinning is polycrystalline silicon (poly) assisted field oxide formation as discussed in U.S. Pat. No. 5,438,016, issued Aug. 1, 1995, which is incorporated herein by reference. With this process, a poly layer is formed in a trench at the narrower areas of the wafer while at the wider areas the poly is removed. As poly oxidizes faster than the silicon wafer, the field oxide forms more quickly in the narrow areas thereby decreasing the difference in thickness between the wide areas and the narrow areas.

With increasing device density field oxide formation is known to stress the semiconductor wafer which affects the electrical properties and the manufacturability of a semiconductor device. As silicon oxidizes to form field oxide, the silicon dioxide formed has a volume of about two times the volume of the preoxidized silicon due to the addition of oxygen atoms. Thus as the field oxide forms it can exert pressure on the wafer and create stress regions within the wafer which can adversely affect the electrical properties of a device formed from the wafer and can physically damage the wafer. A process for oxide formation which imparts less stress to the wafer and reduces field oxide thinning in narrow regions would be desirable.

SUMMARY OF THE INVENTION

The present invention provides a method for reducing problems including stress-related problems associated with the formation of oxide, such as field oxide, during the formation of a semiconductor device. In accordance with one embodiment of the invention, a textured polycrystalline silicon (poly) layer is formed within a trench or other recess of a semiconductor substrate assembly. The texturized polycrystalline silicon may impinge upon itself in narrower areas and form conformally in wider areas of the substrate assembly. In any case, the texturized poly comprises a plurality of voids therein. Next, an etch such a dry vertical etch (a spacer etch) is performed to remove the poly layer from wide horizontal surfaces while leaving a portion of the poly in narrower regions and also along vertical surfaces. Finally, the remaining poly is oxidized, for example to form field oxide. The holes within the texturized poly reduce the stress typically placed upon the substrate assembly during the field oxide formation by absorbing some of the increasing volume as the poly oxidizes.

Objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

Figure 1:
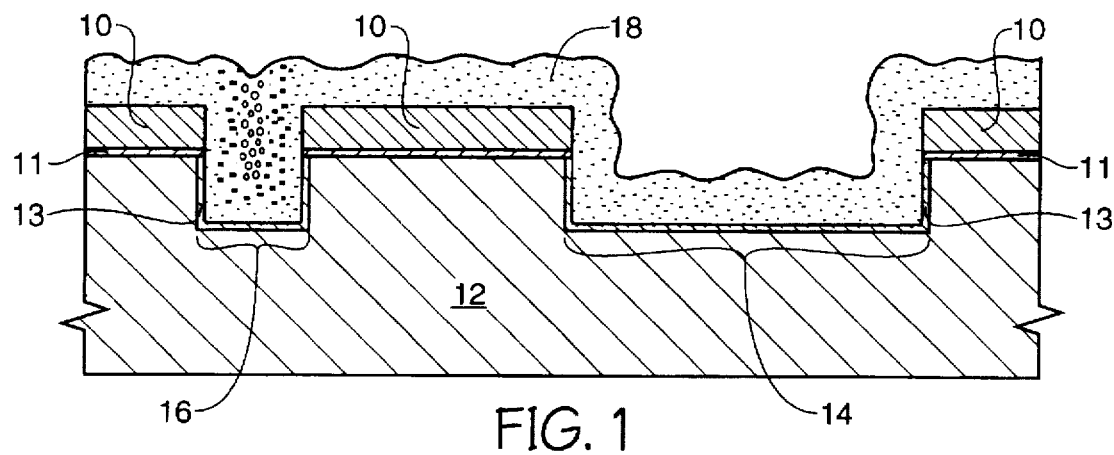
FIG. 1 is a cross section depicting a first step of one inventive embodiment comprising a layer of texturized polycrystalline silicon over a semiconductor substrate assembly

FIG. 1 depicts a first step of an in-process semiconductor wafer assembly in one inventive embodiment of the invention to form a dielectric such as field oxide. As shown in FIG. 1, the wafer assembly comprises a patterned masking layer 10 such as silicon nitride having a pad oxide layer 11 thereunder, each layer formed over a semiconductor material 12 such as a semiconductor wafer. The semiconductor wafer is etched to form a plurality of recesses or trenches therein to define an active area. Subsequently, a thin oxide layer 13 is formed over the recesses. The particular arrangement of FIG. 1 comprises wide recesses 14 and narrow recesses 16, although other arrangements are likely, and the wide and narrow regions are for illustration only. Recesses having a depth of from about 200 angstroms (Å) to about 2000 Å would be sufficient.

Also shown in FIG. 1 is a layer of doped or undoped texturized polycrystalline silicon 18 formed within the recesses and over the surface of the semiconductor wafer assembly. The texturized poly (i.e. "rough" or "rugged" poly) is similar to textured poly used in conductive capacitor plates such as storage nodes to increase the surface area and storage capacity of a capacitor. In this embodiment the poly in the narrower regions impinges on itself (bridges the opening) and in effect forms a thicker layer within the narrower recesses than within the wide recesses. Generally, a poly layer formed half as thick as the width of the narrow area would bridge across the narrow area. As the texturized poly forms, holes or voids develop within the poly which may be larger toward the midline of the narrower recess where the poly impinges upon itself. The texturized poly can be formed using any number of workable processes. For example, the poly can be formed using silane gas ($SiH_4$) and a low pressure chemical vapor deposition (LPCVD) furnace at a temperature of between about 450° C. and about 600° C., such as 555° C., for between about five minutes and about one hour. A target poly thickness of between about 500 Å and about 3,000 Å would be-sufficient depending on the width of the narrow opening, and other thicknesses may be sufficient.

FIG. 1 further depicts areas between the recesses which include an active area site over which, in one embodiment, one or more transistor gates will be formed during subsequent processing steps.

Figure 2:
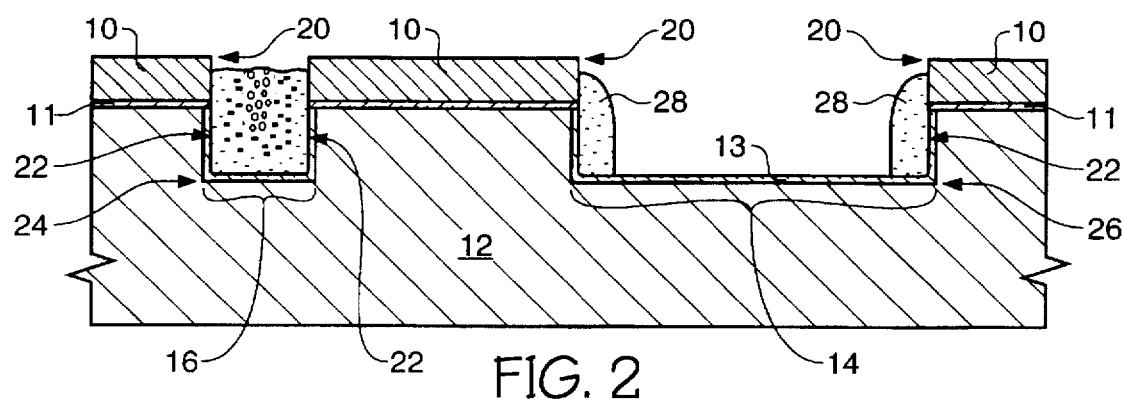
FIG. 2 is a cross section depicting the structure of FIG. 1 after a vertical etch.

Next, a vertical (spacer) etch, such as a poly dry etch using a low pressure $Cl_2$ chemistry, is performed to result in the structure of FIG. 2. The spacer etch removes the poly from a major (nonrecessed) surface 20 of the wafer assembly such that the major surface is generally free from the poly (i.e. the poly is sufficiently removed such that it does not prevent subsequent wafer processing steps), while the poly remains over sidewalls 22 of each recess. In embodiments having wide and narrow recesses, the poly remains over the bottom 24 of the narrow trench but the bottom 26 of the wide recess is generally free from the poly as shown in FIG. 2 (i.e. any poly which remains does not prevent subsequent processing steps). Oxide layer 13 functions as an etch stop to prevent further etching of the wafer during the spacer etch, although it may be possible to use a timed etch rather than an etch stop layer. The spacer etch forms spacers 28 over the sidewalls of the wide recesses, but the narrow recesses remain generally filled with poly.

Figure 3:
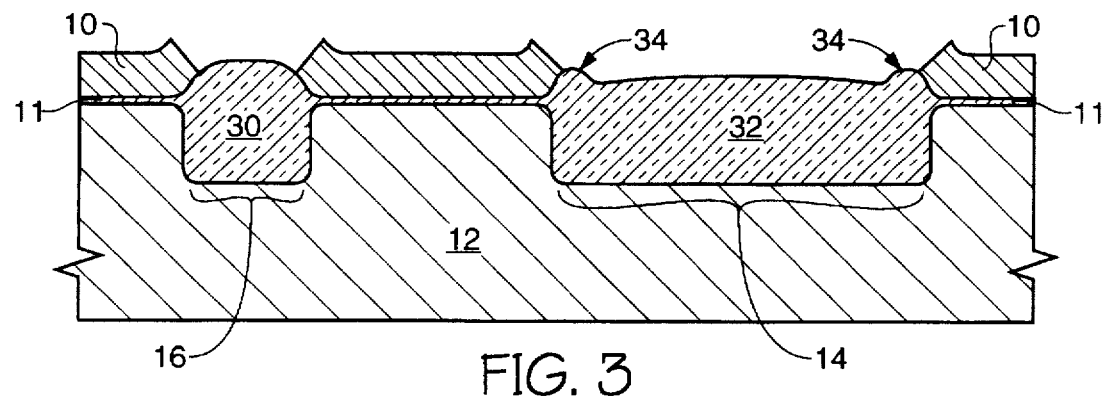
FIG. 3 depicts the structure depicted in FIG. 2 after an oxidation step.

As shown in FIG. 3 the poly and any exposed silicon wafer are oxidized, for example to form field oxide. The poly oxidizes at a faster rate than the semiconductor wafer and as such the field oxide 30 within the narrower areas 16 forms faster than the field oxide 32 formed from the wafer material exposed in the wider regions 14. Thus field oxide thinning in the narrower areas is reduced over previous processes which form field oxide from the wafer exclusively. The field oxide may have various nonplanar features 34 resulting from the difference in oxidation rates between the poly and the silicon of the wafer.

Various methods can be used for forming field oxide. One method is to use a high temperature steam oxidation process wherein oxygen and hydrogen are pumped into an atmospheric furnace at a temperature of between about 990° C. to 1015° C., for example 1007° C., for about 90 minutes to form a 4000 Å oxide layer.

Another advantage of using texturized poly is that it reduces stress imparted to the wafer over processes which oxidize untexturized poly. The holes or voids described previously which form within the texturized poly are filled with a volume of oxidized silicon. In other words, the oxidizing silicon has a void to expand into so that stress placed on the wafer assembly during and after field oxide growth is reduced.

Wafer processing continues, for example including implanting the wafer and forming one or more transistor gates over the active area sites between the trenches.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, the layers shown are illustrative, and various other layers are possible and likely including the use of the invention to form layers other than field oxide. Other texturized oxidizable materials may be used in addition to the illustrative polycrystalline silicon. It is therefore contemplated that the appended claims will cover any such modifications or embodiments as fall within the scope of the invention.

What is claimed is:

1. An in-process semiconductor wafer assembly, comprising:
a wafer of semiconductor material having a major surface and first and second recesses therein, each said recess comprising a bottom and a sidewall;
a layer of texturized oxidizable material formed over said sidewall of each said recess and over said bottoms of said second recesses wherein said oxidizable material in said second recesses comprises holes therein wherein said holes along a midline of said second recesses are larger than holes toward said sidewalls of said second recesses and wherein said major surface and at lease some of said bottoms of said first recesses are generally free from said oxidizable material.

2. The wafer assembly of claim 1 wherein said texturized oxidizable material forms a spacer on said sidewall of at least some of said plurality of recesses.

3. The wafer assembly of claim 1 further comprising:
an active area site between two of said recesses wherein said active area site is absent of any transistor gate.

4. The wafer assembly of claim 1 wherein said assembly is absent of a conductive plate between said texturized oxidizable material and said semiconductor wafer.

5. The wafer assembly of claim 4 further comprising an insulation layer between said texturized oxidizable material and said semiconductor wafer such that said oxidizable material is electrically isolated from said semiconductor wafer.

6. The wafer assembly of claim 1 wherein said texturized oxidizable material is polycrystalline silicon further comprising an insulation layer between said texturized polycrystalline silicon layer and said semiconductor wafer such that said polycrystalline silicon-is electrically isolated from said semiconductor wafer.

7. An in-process semiconductor wafer assembly, comprising:
a wafer assembly comprising semiconductor material having at least first and second recesses therein separated by an active area defined in said wafer, wherein said first recess has a first width and said second recess has a second width wider than said first width;
rough silicon formed within said recesses wherein said rough silicon generally fills said first recess, covers a sidewall of said second recess, and wherein a bottom of said second recess is generally free from said rough silicon.

8. The wafer assembly of claim 7 wherein said rough silicon within said first recess comprises a plurality of holes therein and said holes toward a midline of said rough silicon in said first recess are larger than holes away from said midline.

9. The wafer assembly of claim 7 further comprising an oxide layer interposed between said wafer comprising said semiconductor material and said rough silicon.

10. The wafer assembly of claim 7 wherein said active area is absent of any transistor gate thereover.

11. An in-process semiconductor wafer assembly comprising:
a semiconductor substrate having at least a first recess therein having a first width and a second recesses therein having a second width wider than said first width and wherein said second recess further comprises a bottom and at least first and second sidewalls;
a layer of texturized oxidizable material formed within said first recess and within said second recess over said sidewalls, wherein said bottom of said second recess is free from said texturized oxidizable material;
an active area separating said first recess from said second recess, said active area being absent of any transistor gate thereover and any texturized oxidizable material thereover.

12. The wafer of claim 11 wherein said first recess comprises a bottom and at least first and second sidewalls wherein said layer of texturized oxidizable material covers said bottom and said sidewalls of said first recess.

13. The wafer of claim 12 wherein said sidewalls of said first and second recesses are generally vertical.

14. The wafer of claim 12 wherein said texturized oxidizable material is polycrystalline silicon further comprising an insulation layer between said texturized polycrystalline silicon layer and said semiconductor substrate such that said polycrystalline silicon is electrically isolated from said semiconductor substrate.

15. An in-process semiconductor wafer assembly comprising:
- a semiconductor wafer assembly comprising a first recess having a first width and a second recess having a second width wider than said first width, said first and second recesses each having a bottom;
- a texturized oxidizable material within said first and second recesses and over said bottom of said first recess wherein said bottom of said second recess is generally free from said texturized oxidizable material.

16. The apparatus of claim 15 further comprising a dielectric layer interposed between said texturized material and said wafer assembly in said first and second recesses.

17. The apparatus of claim 15 wherein said texturized layer in said first recess impinges on itself and said texturized layer is conformal with said second recess.

18. An in-process semiconductor wafer assembly comprising:
- a semiconductor wafer assembly comprising a recess;
- a texturized oxidizable material within said recess, said texturized material comprising holes therein wherein said holes along a midline of said recess are larger than holes toward a sidewall of said recess.

19. The wafer assembly of claim 18 wherein said recess is a first recess having a first width and said wafer assembly further comprises a second recess having a second width wider than said first width wherein said texturized material is within said second recess.

20. The wafer assembly of claim 19 wherein said first and second recesses each comprise a bottom wherein said texturized material covers said bottom of said first recess and wherein said bottom of said second recess is generally free from said texturized material.

21. The wafer assembly of claim 19 wherein said texturized material is impinged on itself in said first recess and is conformal with said second recess.

22. The wafer assembly of claim 18 further comprising a bottom of said recess and a dielectric layer interposed between said bottom and said texturized material.

* * * * *

UNITED STATES PATENT AND TRADEMARK OFFICE
CERTIFICATE OF CORRECTION

PATENT NO. : 5,753,962
DATED : May 19, 1998
INVENTOR(S) : Jeng

It is certified that error appears in the above-identified patent and that said Letters Patent is hereby corrected as shown below:

Column 2, line 61, please replace "be-sufficient" with -- be sufficient --.

Column 4, line 5, after "and at" please replace "lease" with -- least --.

Column 4, line 26, please replace "silicon-is" with --silicon is --.

Signed and Sealed this

Second Day of March, 1999

*Attest:*

Q. TODD DICKINSON

*Attesting Officer*     *Acting Commissioner of Patents and Trademarks*